(12) United States Patent
Sykora et al.

(10) Patent No.: US 10,314,200 B2
(45) Date of Patent: Jun. 4, 2019

(54) VARIABLE FREQUENCY DRIVE OPERATION TO AVOID OVERHEATING

(71) Applicant: Trane International Inc., Piscataway, NJ (US)

(72) Inventors: Benjamin James Sykora, Holmen, WI (US); Nathan Thomas West, Oak Creek, WI (US); David Marshall Foye, LaCrosse, WI (US); Korwin Jay Anderson, Pasadean, CA (US)

(73) Assignee: Trane International Inc., Piscataway, NJ (US)

( * ) Notice: Subject to any disclaimer, the term of this patent is extended or adjusted under 35 U.S.C. 154(b) by 783 days.

(21) Appl. No.: 14/802,294

(22) Filed: Jul. 17, 2015

(65) Prior Publication Data
US 2015/0327399 A1    Nov. 12, 2015

Related U.S. Application Data

(63) Continuation of application No. PCT/US2014/012625, filed on Jan. 23, 2014.
(Continued)

(51) Int. Cl.
*H05K 7/20* (2006.01)
*H01L 23/427* (2006.01)
(Continued)

(52) U.S. Cl.
CPC ....... *H05K 7/20254* (2013.01); *H01L 23/427* (2013.01); *H02P 29/60* (2016.02);
(Continued)

(58) Field of Classification Search
CPC ........... H01L 23/427; H01L 2924/0002; H01L 2924/00; H01L 2924/000002;
(Continued)

(56) References Cited

U.S. PATENT DOCUMENTS

| | | | |
|---|---|---|---|
| 3,656,540 A | 4/1972 | Henrici | |
| 4,358,929 A | * 11/1982 | Molivadas | F03G 6/003 126/636 |

(Continued)

FOREIGN PATENT DOCUMENTS

| | | |
|---|---|---|
| CH | 515470 | 11/1971 |
| CN | 102857158 | 1/2013 |

(Continued)

OTHER PUBLICATIONS

Korean Intellectual Property Office, International Application Division, International Search Report and Written Opinion issued in corresponding International Application No. PCT/US2014/012625, dated Apr. 18, 2014, 13 pp.

*Primary Examiner* — Caridad Everhart
(74) *Attorney, Agent, or Firm* — Taft Stettinius & Hollister LLP

(57) ABSTRACT

Operation of a variable frequency in a manner configured to avoid overheating is provided. In one form, a method includes providing a variable frequency drive that includes a switching device in thermal communication with a heat sink including a thermal mass. The method further includes operating the drive in a first mode before active cooling of the heat sink is established and a second mode following the first mode. Operation of the drive in the first mode includes operating the switching device in a first switching frequency mode, and the first switching frequency mode and the thermal mass of the heat sink are selected to provide a temperature of the switching device below a predetermined threshold before active cooling of the heat sink is established. Further embodiments, forms, features, and aspects shall become apparent from the description and drawings.

30 Claims, 2 Drawing Sheets

Related U.S. Application Data

(60) Provisional application No. 61/755,630, filed on Jan. 23, 2013.

(51) Int. Cl.
  *H02P 29/60* (2016.01)
  *H02P 27/04* (2016.01)

(52) U.S. Cl.
  CPC .. *H05K 7/20945* (2013.01); *H01L 2924/0002* (2013.01); *H02P 27/04* (2013.01)

(58) Field of Classification Search
  CPC ............ H05K 7/20945; H05K 7/20254; H02P 29/60; H02P 27/04
  See application file for complete search history.

(56) References Cited

U.S. PATENT DOCUMENTS

| | | | |
|---|---|---|---|
| 6,116,040 A * | 9/2000 | Stark | F04B 39/06 62/113 |
| 6,604,372 B2 * | 8/2003 | Baumert | B60H 1/3205 62/199 |
| 6,866,092 B1 * | 3/2005 | Molivadas | F01L 3/12 123/41.2 |
| 8,030,863 B2 | 10/2011 | Yoshida | |
| 8,138,711 B2 | 3/2012 | Hwang et al. | |
| 10,041,840 B2 * | 8/2018 | West | G01K 1/16 |
| 2005/0162140 A1 * | 7/2005 | Hirst | G05F 1/40 323/273 |
| 2006/0130501 A1 * | 6/2006 | Singh | F25B 49/027 62/183 |
| 2011/0194256 A1 * | 8/2011 | De Rijck | H01L 23/34 361/717 |
| 2013/0002178 A1 | 1/2013 | Endou et al. | |
| 2013/0286591 A1 * | 10/2013 | Myers | H05K 7/20927 361/700 |

FOREIGN PATENT DOCUMENTS

| | | | | |
|---|---|---|---|---|
| JP | H07-143615 A | 6/1995 | | |
| JP | 2002171750 | * | 6/2002 | ............ G03G 21/00 |
| JP | 2003-018861 A | 1/2003 | | |
| JP | 2012-135119 A | 7/2012 | | |
| KR | 10-2009-0039484 A | 4/2009 | | |
| KR | 101151712 | 5/2012 | | |
| WO | 2007069779 A1 | 6/2007 | | |

\* cited by examiner

VARIABLE FREQUENCY DRIVE OPERATION TO AVOID OVERHEATING

BACKGROUND

The present application relates to the operation of a variable frequency drive to avoid overheating, and more particularly but not exclusively, to the operation of the drive in a manner configured to avoid overheating during a period when active cooling of the heat sink is not established.

As the use of variable frequency drives to control electric motors becomes more commonplace, further advances in the design and operation of the same are desired. For example, the temperature of the internal junction of a switching device of a variable frequency drive can be a limiting factor to its operation. Indeed, if the maximum temperature rating of the internal junction of the switching device is exceeded, then the variable frequency drive may overheat and damage and/or failure of the variable frequency drive may result. In contrast, the life and reliability of the variable frequency drive may be enhanced if the temperature of the internal junction of the switching device does not exceed its maximum temperature rating. A variable frequency drive may include a heat sink having a thermal mass or capacity operable to absorb heat that is generated during its operation, and to transfer absorbed heat to a cooling medium which carries the transferred heat away from the heat sink. In this arrangement, the heat sink and related cooling medium can be effective in controlling the temperature of the internal junction of the switching device. However, in certain instances supply of the cooling medium to the heat sink may be delayed or interrupted. For example, the supply of the cooling medium to the heat sink may be delayed following start-up or initial operation of the variable frequency drive. In this and related instances, the absence of the cooling medium may result in the heat sink losing its operability to maintain the heat absorption needed in order to avoid exceeding the maximum temperature rating of the internal junction of the switching device.

In view of the foregoing, there is a demand for further improvements in this area of technology.

SUMMARY

Operation of a variable frequency in a manner configured to avoid overheating is provided. In one form, a method includes providing a variable frequency drive that includes a switching device in thermal communication with a heat sink including a thermal mass. The method further includes operating the drive in a first mode before active cooling of the heat sink is established and a second mode following the first mode. Operation of the drive in the first mode includes operating the switching device in a first switching frequency mode, and the first switching frequency mode and the thermal mass of the heat sink are selected to provide a temperature of the switching device below a predetermined threshold before active cooling of the heat sink is established.

In one embodiment, a method includes providing a variable frequency drive including a switching device in thermal communication with a heat sink including a thermal mass; and operating the drive in a first mode before active cooling of the heat sink is established and a second mode following the first mode. Operation of the drive in the first mode includes operating the switching device in a first switching frequency mode, and the first switching frequency mode and the thermal mass of the heat sink are selected to provide a temperature of the switching device below a predetermined threshold before active cooling of the heat sink is established.

In still another embodiment, a system includes a variable frequency drive including a switching device in thermal communication with a heat sink including a thermal mass. The system also includes a controller configured to operate the drive in a run mode and a start mode where switching frequency of the switching device is altered relative to the run mode. In addition, the start mode switching frequency and the thermal mass of the heat sink are configured to maintain a temperature of the switching device within a predetermined threshold before cooling of the heat sink is established.

In yet another embodiment, a method includes providing a variable frequency drive including a switching device in thermal communication with a heat sink; operating the drive in a first mode; determining cooling of the heat sink; and operating the drive in a second mode in response to determining cooling of the heat sink. The operation of the drive in the second mode includes an increased frequency of switching operations of the switching device relative to the first mode.

Other aspects include unique methods, techniques, systems, devices, kits, assemblies, equipment, and/or apparatus related to the avoidance of exceeding a temperature rating of a variable frequency drive.

Further aspects, embodiments, forms, features, benefits, objects, and advantages shall become apparent from the detailed description and figures provided herewith.

DETAILED DESCRIPTION OF REPRESENTATIVE EMBODIMENTS

Figure 1:
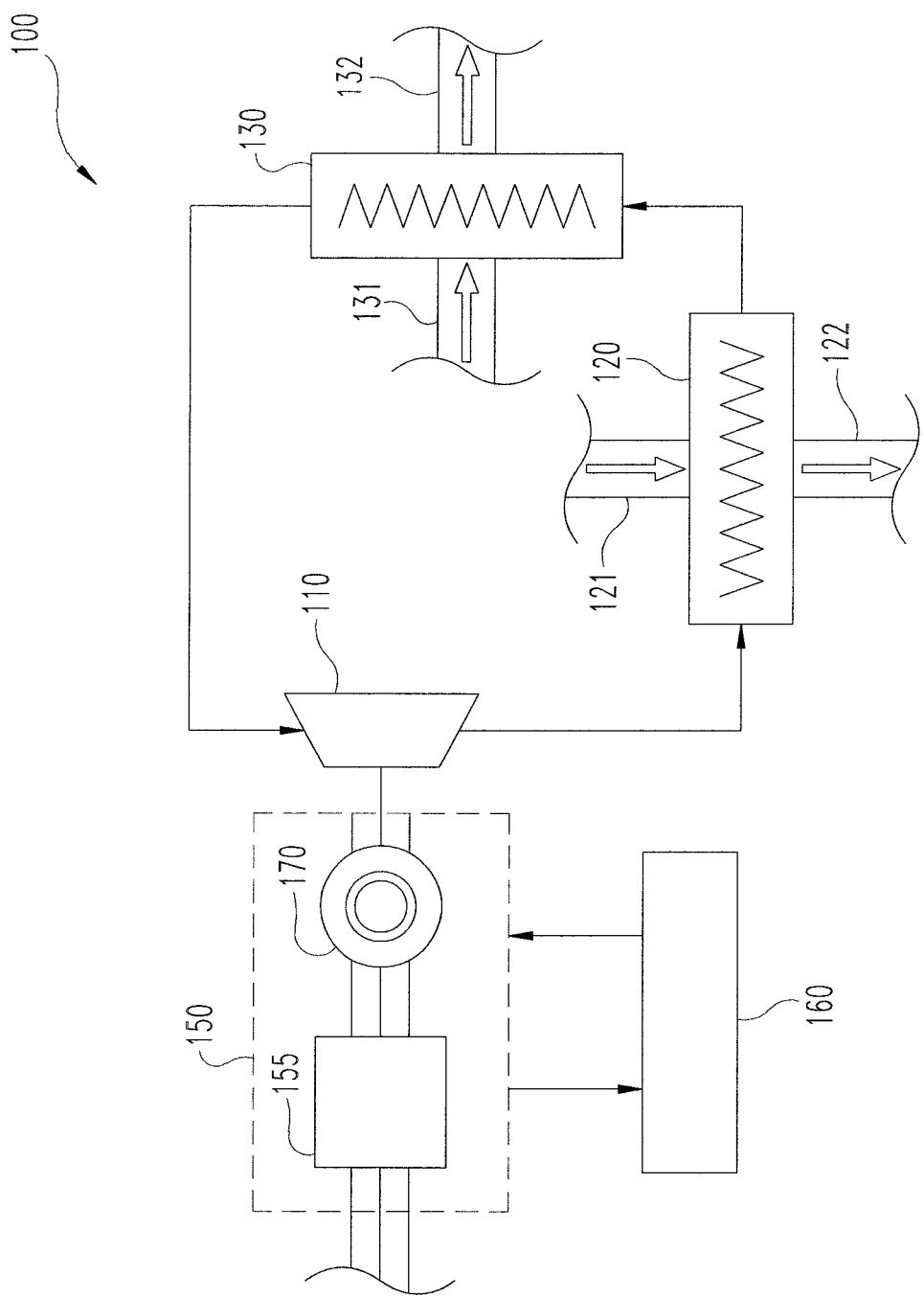
FIG. 1 is a schematic illustration of an exemplary system including a variable frequency drive.

For purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

In one aspect, operation of a variable frequency in a manner configured to avoid overheating is provided. In one form, a method includes providing a variable frequency drive that includes a switching device in thermal communication with a heat sink including a thermal mass. The method further includes operating the drive in a first mode before active cooling of the heat sink is established and a second mode following the first mode. Operation of the drive in the first mode includes operating the switching device in a first switching frequency mode, and the first switching frequency mode and the thermal mass of the heat sink are selected to provide a temperature of the switching device below a predetermined threshold before active cooling of the heat sink is established. Further embodiments, forms, features, and aspects shall become apparent from the description and drawings.

The operation of a variable frequency drive to avoid overheating or exceeding the maximum temperature rating of the internal junction of its switching device disclosed herein may be performed or conducted in connection with a variable frequency drive being used in one of a variety of different applications. By way of non-limiting example, chiller system 100 illustrated in FIG. 1 is one application where operation of a variable frequency drive to avoid overheating or exceeding the maximum temperature rating of the internal junction of its switching device may be implemented. Chiller system 100 includes a refrigerant loop that includes a compressor 110, a condenser 120, and an evaporator 130. Refrigerant flows through system 100 in a closed loop from compressor 110 to condenser 120 to evaporator 130 and back to compressor 110. Various embodiments may also include additional refrigerant loop elements including, for example, valves for controlling refrigerant flow, refrigerant filters, economizers, oil separators and/or cooling components and flow paths for various system components.

Compressor 110 is driven by a drive unit 150 including an electric motor 170 which is driven by a variable frequency drive 155. In one form, variable frequency drive 155 is configured to output a three-phase PWM drive signal, and motor 170 is a surface magnet permanent magnet motor. Use of other types and configurations of variable frequency drives and electric motors such as interior magnet permanent magnet motors, reluctance motors, or inductance motors are also contemplated. It shall be appreciated that the principles and techniques disclosed herein may be applied to a broad variety of drive and permanent magnet motor configurations.

Condenser 120 is configured to transfer heat from compressed refrigerant received from compressor 110. In one form, condenser 120 is a water cooled condenser which receives cooling water at an inlet 121, transfers heat from the refrigerant to the cooling water, and outputs cooling water at an output 122. It is also contemplated that other types of condensers may be utilized, for example, air cooled condensers or evaporative condensers. It shall further be appreciated that references herein to water include water solutions comprising additional constituents unless otherwise limited.

Evaporator 130 is configured to receive refrigerant from condenser 120, expand the received refrigerant to decrease its temperature and transfer heat from a cooled medium to the refrigerant. In one form, evaporator 130 is configured as a water chiller which receives water provided to an inlet 131, transfers heat from the water to the refrigerant, and outputs chilled water at an outlet 132. It is contemplated that a number of particular types of evaporators and chiller systems may be utilized, including dry expansion evaporators, flooded type evaporators, bare tube evaporators, plate surface evaporators, and finned evaporators among others.

Chiller system 100 further includes a controller 160 which outputs control signals to variable frequency drive 155 to control operation of motor 170 and compressor 110. Controller 160 also receives information about the operation of drive unit 150 including, but not limited to, information relating to motor current, motor terminal voltage, and/or other operational characteristics of motor 170 and variable frequency drive 155. It shall be appreciated that the controls, control routines, and control modules described herein may be implemented using hardware, software, firmware and various combinations thereof and may utilize executable instructions stored in a non-transitory computer readable medium or multiple non-transitory computer readable media. It shall further be understood that controller 160 may be provided in various forms and may include a number of hardware and software modules and components such as those disclosed herein.

Figure 2:
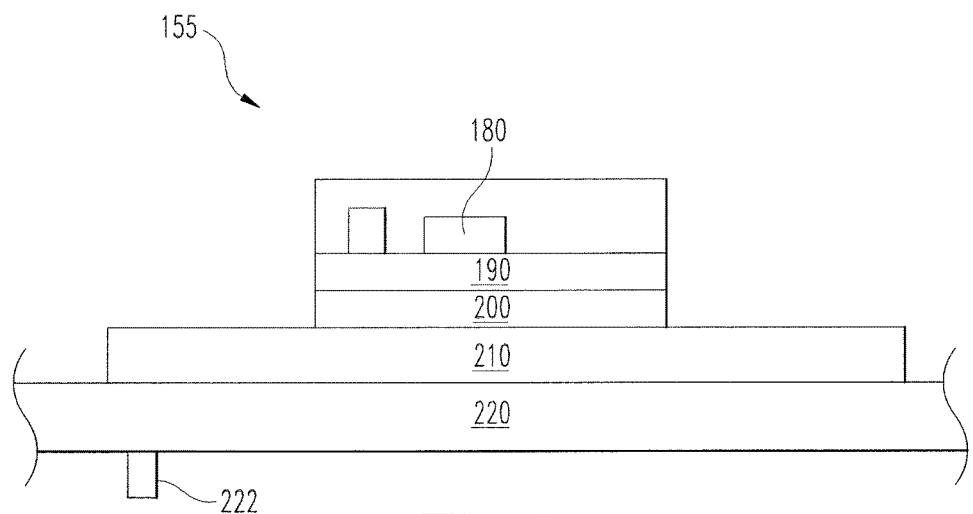
FIG. 2 is a schematic illustration of the variable frequency drive of the system of FIG. 1.

Turning now to FIG. 2, one non-limiting arrangement of variable frequency drive 155 is schematically illustrated. Variable frequency drive 155 includes a switching device 180 positioned on and in thermal communication with a thermally conductive base or substrate 190. Switching device 180 includes one or more internal switching junctions and in one non-limiting embodiment is in the form of one or more insulated gate bipolar transistors (IGBT's). In another form, switching device 180 is a power MOSFET. Base 190 may be formed from a variety of different thermally conductive materials or combinations of materials. For example, in one particular but non-limiting form, base 190 is formed from copper or an alloy thereof. A thermal pad 200 is positioned between base 190 and a heat sink 210, although forms in which thermal pad 200 is omitted and base 190 is positioned directly on heat sink 210 are also contemplated. It should further be understood that forms in which one or more additional components are positioned between switching device 180 and base 190 and/or between base 190 and heat sink 210 are possible.

Heat sink 210 is formed of a thermally conductive material and is in thermal communication with base 190. Heat sink 210 also includes a thermal mass or capacity and is operable to absorb and store heat created during operation of variable frequency drive 155. It should be understood that the amount of heat or thermal energy heat sink 210 is operable to absorb and store is limited by its thermal mass or capacity. Similarly, once the thermal mass or capacity of heat sink 210 is reached, it will no longer be able to absorb additional heat created during operation of variable frequency drive 155. Additionally or alternatively, as the amount of heat absorbed by heat sink 210 nears its thermal capacity, it may no longer be operable to absorb heat at the rate at which it is created during operation of variable frequency drive 155. In either instance, the diminished or terminated operability of heat sink 210 to absorb heat produced during operation of variable frequency drive 155 can result in the internal junction of switching device 180 exceeding its maximum temperature rating.

In order to avoid the above instances where the amount of heat absorbed by heat sink 210 nears or reaches the thermal mass or capacity of heat sink 210, and to likewise avoid the internal junction of switching device 180 from exceeding its maximum temperature rating, a cooling circuit 220 is positioned adjacent to heat sink 210 and configured to direct a coolant or cooling medium such as refrigerant from a primary cooling loop or coolant from a secondary cooling loop, into thermal communication with heat sink 210 such that the cooling medium may absorb heat from heat sink 210 and carry transferred heat away from heat sink 210. In the illustrated form, cooling circuit 220 is coupled with the refrigerant loop that includes compressor 110, condenser 120, and evaporator 130, and the cooling medium that absorbs and transfers heat away from heat sink 210 is refrigerant of the refrigerant loop. However, it should be understood that other forms for the cooling medium are possible, non-limiting examples of which include air, water, or glycol, just to provide a few possibilities. In one non-illustrated form, cooling circuit 220 and the cooling medium could be part of a separate heat transfer system where cooling circuit 220 forms a closed loop for the cooling medium and a heat exchanger is configured to release heat from the cooling medium to ambient environment or another cooling medium, although other variations are possible, for example an open loop liquid circuit where the cooling medium is ambient air or another fluid. It should also be appreciated that the thermal mass of heat sink 210 may include contributions of thermal mass from a cooling medium which is resident in cooling circuit 220 before flow of the cooling medium occurs.

Variable frequency drive 155 also includes a sensor 222 configured to determine presence of the cooling medium in cooling circuit 220 adjacent to heat sink 210. In one form, sensor 222 is configured to determine presence of the cooling medium by detecting flow of the cooling medium in cooling circuit 220. Additionally or alternatively, forms in which sensor 222 is configured to determine presence of the cooling medium by detecting a pressure change in cooling circuit 220 are possible. It is also contemplated that detection of a pressure change at other locations of the refrigerant loop could be utilized to determine presence of the cooling medium in cooling circuit 220. Sensor 222 is further configured to provide an indication to controller 160 that cooling of heat sink 210 is established in response to determining the presence of the cooling medium in cooling circuit 220 adjacent to heat sink 210. In certain forms, following determination that cooling of heat sink 210 has been established, sensor 222 may be further configured to determine the absence or interrupted flow of the cooling medium in cooling circuit 220 and provide an indication to controller 160 that cooling of heat sink 210 has failed or been interrupted. It is further contemplated that variable frequency drive 155 may include one or more additional sensors positioned at different locations and configured to measure temperatures and provide sensed temperature values of one or more components to controller 160. For example, in one non-illustrated form, variable frequency drive 155 may further include a sensor configured to measure temperature of heat sink 210 and provide a sensed temperature value of heat sink 210 to controller 160. Further, alternative approaches for determining that cooling of heat sink 210 has been established are also possible. For example, controller 160 may be configured to determine that cooling of heat sink 210 has been established based on a sensed temperature value of heat sink 210 or changes in sensed temperature values of heat sink 210. In still another form, controller 160 may be configured to determine that cooling of heat sink 210 has been established after a predetermined period of time has passed following start-up or initiating operation of variable frequency drive 155.

As described above, cooling of heat sink 210 may help avoid the internal junction of switching device 180 from exceeding its maximum temperature rating. However, cooling of heat sink 210 may be delayed, interrupted or fail during operation of variable frequency drive 155. For example, referring to the system illustrated in FIG. 1, the presence or flow of refrigerant in cooling circuit 220 adjacent to heat sink 210 may be delayed following start-up or initial operation of variable frequency drive 155. During these periods of time, normal operation of variable frequency drive 155 may result in heat sink 210 nearing or reaching its thermal mass or capacity and the internal junction of switching device 180 exceeding its maximum temperature rating. One non-limiting approach for avoiding overheating of variable frequency drive 155 during one of these periods, i.e., when cooling of heat sink 210 is delayed following start-up or initial operation of variable frequency drive 155, is graphically illustrated in FIG. 3.

Figure 3:
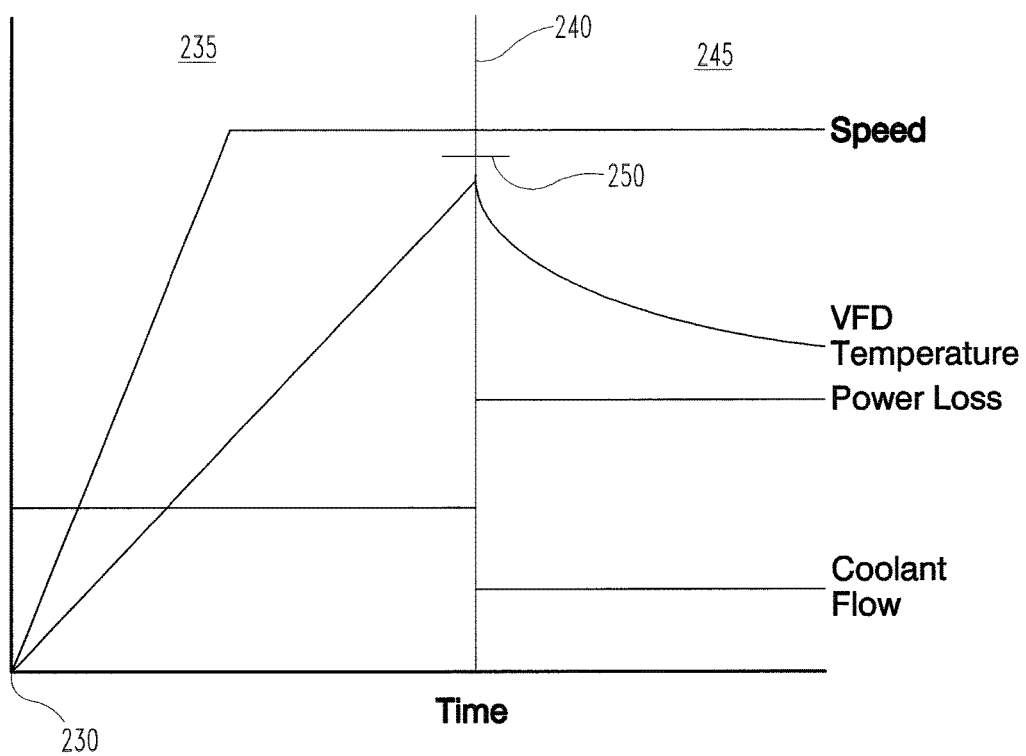
FIG. 3 is a graphical illustration of one approach for operating the variable frequency drive of the system of FIG. 1.

In the approach illustrated in FIG. 3, controller 160 is configured to operate variable frequency drive 155 in a first mode that includes a first switching frequency mode 235 following start-up or initial operation of variable frequency drive 155 at time 230 and a second mode that includes a second switching frequency mode 245 following operation of variable frequency drive 155 in the first mode. Generally speaking, first switching frequency mode 235 and the thermal mass or capacity of heat sink 210 are factored together such that the internal junction temperature of switching device 180 remains below a predetermined threshold 250 before cooling of heat sink 210 is established. In one non-limiting aspect, predetermined threshold 250 corresponds to the maximum temperature rating of the internal junction of switching device 180. First switching frequency mode 235 generally includes a switching frequency or frequency of switching operations of switching device 180 that is lower than it is in second switching frequency mode 245. As a result, the thermal output of variable frequency drive 155 during operation in first switching frequency mode 235 is less than it is during operation in second switching frequency mode 245.

It should be appreciated that the exact frequency chosen for first switching frequency mode 235 will depend on and/or be limited by the thermal mass or capacity of heat sink 210. For example, while increasingly lower frequencies will increasingly reduce thermal output of variable frequency drive 155, operation of variable frequency drive 155 at such low frequencies may have undesirable side effects. Similarly, when heat sink 210 is provided with an appropriately sized thermal mass or capacity, the frequency chosen for first switching frequency mode 235 will still reduce thermal output of variable frequency drive 155 but will be above those frequencies at which undesirable side effects occur prevalently or at all. Further, as the thermal mass or capacity of heat sink 210 increases, the frequency chosen for first switching frequency mode 235 may also increase.

Turning again to FIG. 3, the approach illustrated therein utilizes a switching frequency in first switching frequency mode 235 and a thermal mass or capacity of heat sink 210 that result in the internal junction of switching device 180 reaching a maximum temperature around time 240, which also corresponds to the time at which sensor 222 determines and provides an indication to controller 160 that cooling of heat sink 210 has been established. Time 240 also represents the point at which controller 160 begins operating variable frequency drive 155 in second frequency switching mode 245 based on receiving the indication from sensor 222 that cooling of heat sink 210 has been established. While not previously indicated, it should be understood that second frequency switching mode 245 may generally represent a typical run mode of variable frequency drive 155. Further, forms in which cooling of heat sink 210 is established and controller 160 switches between the first and second switching frequency modes 235, 245 at different points in time relative to one another are also possible. For example, controller 160 may be configured to delay switching operation of variable frequency drive 155 from the first switching frequency mode 235 to the second switching frequency mode 245 for some period of time after sensor 222 provides the indication that cooling of heat sink 210 has been established.

It should be understood that operation of variable frequency drive 155 in first switching frequency mode 235 may be implemented based on a number of different approaches. For example, forms in which the first switching frequency mode 235 utilizes a discontinuous pulse width modulation signal, a lower switching frequency than that utilized in second switching frequency mode 245, or an altered pattern of a pulse width modulation relative to that utilized in second switching frequency mode 245 are all possible and contemplated.

Further variations in the approach illustrated in FIG. 3 are also possible. For example, while FIG. 3 illustrates switching operation of variable frequency drive 155 from first switching frequency mode 235 to second switching frequency mode 245 at the same point in time that cooling of heat sink 210 is established, it should be appreciated that forms in which switching operation of variable frequency drive 155 from first switching frequency mode 235 to second switching frequency mode 245 is conducted before cooling of heat sink 210 is established are contemplated and possible. For example, in one alternative, non-illustrated form, switching from first switching frequency mode 235 to second switching frequency mode 245 may be conducted before cooling of heat sink 210 is established if the thermal mass or capacity of heat sink 210 is greater than that of the exemplary thermal mass or capacity of heat sink 210 in the approach of FIG. 3. In this form, controller 160 may be configured to switch operation of variable frequency drive 155 from first switching frequency mode 235 to second switching frequency mode 245 at a point in time which occurs before a predetermined point in time that corresponds to the typical time at which cooling of heat sink 210 is established. In this regard, the increased thermal mass or capacity of heat sink 210 will enable heat sink 210 to absorb the additional heat generated by variable frequency drive 155 in the interim time between switching operation of variable frequency drive 155 to second switching frequency mode 245 and cooling of heat sink 210 is established. In this form, sensor 222 could still provide an indication to controller 160 that cooling of heat sink 210 has been established, and controller 160 can maintain operation of variable frequency drive 155 in second mode 245 in response to such an indication. However, if this indication is not provided by sensor 222 to controller 160 within a predetermined period time after switching operation of variable frequency drive 155 to second switching frequency mode 245, or another temperature sensor indicates that a component of variable frequency drive 155 such as heat sink 210 is approaching or exceeding a predetermined value, then controller 160 may be configured to switch operation of variable frequency drive 155 back to first switching frequency mode 235 or otherwise alter or terminate operation of variable frequency drive 155 to avoid damage thereto. Additionally or alternatively, switching operation of variable frequency drive 155 from first switching frequency mode 235 to second switching frequency mode 245 before cooling of heat sink 210 is established may be performed in forms which utilize a switching frequency mode that further reduces the frequency of operation of switching device 180 relative to the representative first switching frequency mode 235 in the approach of FIG. 3.

Forms are also possible where switching operation of variable frequency drive 155 from first switching frequency mode 235 to second switching frequency mode 245 may be delayed after cooling of heat sink 210 is established. For example, in one such form, delaying switching operation of variable frequency drive 155 from first switching frequency mode 235 to second switching frequency mode 245 after cooling of heat sink 210 is established may be performed if the thermal mass or capacity of heat sink 210 is smaller than that of the exemplary thermal mass or capacity of heat sink 210 in the approach of FIG. 3. Additionally or alternatively, delaying switching operation of variable frequency drive 155 from first switching frequency mode 235 to second switching frequency mode 245 after cooling of heat sink 210 is established may be performed in forms which utilize a switching frequency mode that increases the frequency of operation of switching device 180 relative to the representative first switching frequency mode 235 in the approach of FIG. 3. While these alternative forms may differ from the representative approach of FIG. 3 in certain aspects, it should be understood that these variations are also configured such that the first switching frequency mode and the thermal mass or capacity of heat sink 210 will prevent the internal junction temperature of switching device 180 from exceeding predetermined threshold 250.

Although the approach of FIG. 3 has been described in connection with starting or initiating operation of variable frequency drive 155 before cooling of heat sink 210 is established, it should be understood that this approach and variations thereof may also be implemented in instances where variable frequency drive 155 is operating in second switching frequency mode 245. For example, if cooling of heat sink 210 is lost or fails, then it may be necessary to switch from second switching frequency mode 245 to first switching frequency mode 235 in order to reduce and/or limit thermal output of variable frequency drive 155 and avoid damage thereto. In these forms, sensor 222 may be configured to sense if cooling to heat sink 210 is lost or fails after variable frequency drive 155 is operating in second switching frequency mode 245, and to provide controller 160 with a corresponding indication of such occurrence. In response, controller 160 is configured to switch operation of variable frequency drive 155 to first switching frequency mode 235 to limit thermal output of variable frequency drive 155 until sensor 222 provides an indication to controller 160 that cooling of heat sink 210 has been reestablished. Controller 160 may be further configured to terminate operation of variable frequency drive 155 if sensor 222 fails to provide such an indication to controller 160 within a predetermined period of time or a temperature reading of heat sink 210 or another component of variable frequency drive 155 meets or exceeds a predetermined threshold.

It shall be further understood that the techniques, methods, controls, diagnostics, and logic disclosed herein may be implemented in a variety of software, hardware, firmware, and combinations thereof.

While the invention has been illustrated and described in detail in the drawings and foregoing description, the same is to be considered as illustrative and not restrictive in character, it being understood that only certain embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

What is claimed is:

1. A method, comprising:
providing a variable frequency drive including a switching device in thermal communication with a heat sink including a thermal mass; and
operating the drive in a first mode before active cooling of the heat sink is established and a second mode following the first mode;
wherein operation of the drive in the first mode includes operating the switching device in a first switching frequency mode; and
wherein the first switching frequency mode and the thermal mass of the heat sink are selected to provide a temperature of the switching device below a predetermined threshold before active cooling of the heat sink is established.

2. The method of claim 1, wherein the second mode includes operating the switching device in a second switching frequency mode, and the first switching frequency mode comprises a switching frequency that is lower than the switching frequency of the second switching frequency mode.

3. The method of claim 1, further comprising determining coolant flow to the heat sink and changing operation of the drive from the first mode to the second mode in response to determining coolant flow.

4. The method of claim 1, wherein the predetermined threshold corresponds to a maximum junction temperature of the switching device.

5. The method of claim 1, further comprising switching operation of the drive from the first mode to the second mode upon establishing cooling to the drive.

6. The method of claim 1, further comprising switching operation of the drive from the first mode to the second mode before cooling to the drive is established.

7. The method of claim 1, wherein the switching device comprises an IGBT.

8. The method of claim 1, wherein operation of the drive in the second mode includes operating the switching device in a second switching frequency mode.

9. The method of claim 8, wherein the first switching frequency mode utilizes a discontinuous pulse width modulation signal controlling operation of the drive.

10. The method of claim 8, wherein the first switching frequency mode uses a lower switching frequency than the second switching frequency mode.

11. A system, comprising:
a variable frequency drive including a switching device in thermal communication with a heat sink including a thermal mass; and
a controller configured to operate the drive in a run mode and a start mode where switching frequency of the switching device is altered relative to the run mode, wherein the start mode switching frequency and the thermal mass of the heat sink are configured to maintain a temperature of the switching device within a predetermined threshold before cooling of the heat sink is established.

12. The system of claim 11, wherein the start mode switching frequency is limited based upon thermal mass or capacity of the heat sink.

13. The system of claim 11, wherein the controller is further configured to provide a lower switching frequency in the first mode relative to the second mode.

14. The system of claim 11, wherein the controller is further configured to provide a discontinuous pulse width modulation signal during operation of the drive in the start mode.

15. The system of claim 11, wherein the controller is further configured to provide an altered pattern of a pulse width modulation signal during operation of the drive in the start mode relative to the run mode.

16. The system of claim 11, wherein the predetermined threshold corresponds to a maximum rated junction temperature of the switching device.

17. The system of claim 11, wherein the switching device comprises an IGBT.

18. The system of claim 11, further comprising at least one sensor configured to determine coolant flow to the heat sink and provide an indication to the controller that cooling of the heat sink is established in response to determining coolant flow.

19. The system of claim 18, wherein the controller is further configured to operate the drive in the run mode in response to the indication.

20. The system of claim 11, further comprising an electric motor and a refrigeration loop including a compressor operatively coupled with the motor, a condenser, and an evaporator.

21. The system of claim 20, wherein the drive is configured to operate the motor to drive the compressor.

22. The system of 20, wherein the heat sink is coupled with the refrigeration loop.

23. A method, comprising:
providing a variable frequency drive including a switching device in thermal communication with a heat sink;
operating the drive in a first mode with a first switching frequency;
determining cooling of the heat sink; and
operating the drive in a second mode in response to determining cooling of the heat sink, wherein operation of the drive in the second mode includes an increased frequency of switching operations of the switching device relative to the first mode;
wherein the first switching frequency and a thermal mass of the heat sink are predetermined to provide a temperature of the switching device below a predetermined threshold before active cooling of the heat sink is established.

24. The method of claim 23, wherein operation of the drive in the first mode is performed during a start-up period.

25. The method of claim 23, wherein determining cooling of the heat sink includes sensing a pressure change in a cooling circuit positioned in thermal communication with the heat sink.

26. The method claim 23, wherein determining cooling of the heat sink includes sensing coolant flow in a cooling circuit positioned in thermal communication with the heat sink.

27. The method of claim 23, wherein determining cooling of the heat sink includes sensing a temperature change of the heat sink.

28. The method of claim 23, wherein determining cooling of the heat sink results from expiration of a predetermined period of time following initiation of operating the drive in the first mode.

29. The method of claim 23, wherein determining cooling of the heat sink includes sensing a cooling medium at the heat sink.

30. The method of claim 29, wherein the cooling medium is refrigerant from a refrigeration loop including a compressor operatively coupled with a motor, a condenser, and an evaporator.

\* \* \* \* \*